(12) United States Patent
Matsuda

(10) Patent No.: US 11,884,820 B2
(45) Date of Patent: Jan. 30, 2024

(54) SILICONE GEL COMPOSITION AND CURED PRODUCT THEREOF, AND POWER MODULE

(71) Applicant: SHIN-ETSU CHEMICAL CO., LTD., Tokyo (JP)

(72) Inventor: Tsuyoshi Matsuda, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 557 days.

(21) Appl. No.: 17/265,480

(22) PCT Filed: Jul. 12, 2019

(86) PCT No.: PCT/JP2019/027647
§ 371 (c)(1),
(2) Date: Feb. 2, 2021

(87) PCT Pub. No.: WO2020/026760
PCT Pub. Date: Feb. 6, 2020

(65) Prior Publication Data
US 2021/0317310 A1    Oct. 14, 2021

(30) Foreign Application Priority Data
Aug. 3, 2018 (JP) ................................. 2018-147069

(51) Int. Cl.
*C08L 83/04* (2006.01)

(52) U.S. Cl.
CPC ......... *C08L 83/04* (2013.01); *C08L 2205/025* (2013.01)

(58) Field of Classification Search
CPC .................................................... C08L 83/04
See application file for complete search history.

(56) References Cited

U.S. PATENT DOCUMENTS

| | | |
|---|---|---|
| 4,780,554 A | 10/1988 | Quirk et al. |
| 2014/0319669 A1 | 10/2014 | Kimijima et al. |

FOREIGN PATENT DOCUMENTS

| | | |
|---|---|---|
| JP | 61-129184 A | 6/1986 |
| JP | 2010-84101 A | 4/2010 |
| JP | 2014-150204 A | 8/2014 |
| JP | 2014-216558 A | 11/2014 |
| JP | 2015-220238 A | 12/2015 |
| JP | 2018-53015 A | 4/2018 |
| JP | 2019-1885 A | 1/2019 |
| JP | 2019-14779 A | 1/2019 |

OTHER PUBLICATIONS

International Search Report for PCT/JP2019/027647 (PCT/ISA/210) dated Oct. 15, 2019.
Written Opinion of the International Searching Authority for PCT/JP2019/027647 (PCT/ISA/237) dated Oct. 15, 2019.

*Primary Examiner* — Wenwen Cai
(74) *Attorney, Agent, or Firm* — Birch, Stewart, Kolasch & Birch, LLP

(57) ABSTRACT

This silicone gel composition contains
(A) an organopolysiloxane having one or more silicon atom-bonded alkenyl groups per molecule,
(B) an organohydrogen polysiloxane having two or more silicon atom-bonded hydrogen atoms per molecule,
(C) a platinum group metal-based curing catalyst,
(D) an isocyanuric acid derivative having two trialkoxysilyl groups and one crosslinkable vinyl group and/or an isocyanuric acid derivative having three trialkoxysilyl groups, and
(E) a ketenesilylacetal-type compound, and provides a cured product having a specific penetration.

The silicone gel composition can provide a silicone gel cured product that is a silicone gel having excellent heat resistance and adhesiveness to metals at high temperature and having a high penetration, that is capable of maintaining a low elastic modulus and a low stress even in use at high temperature for long periods of time, and that enables reduction of the occurrence of bubbles and reduction of deterioration in releasability from a substrate and in electrical insulating properties.

8 Claims, No Drawings

SILICONE GEL COMPOSITION AND CURED PRODUCT THEREOF, AND POWER MODULE

TECHNICAL FIELD

The present invention relates to a silicone gel composition which is cured to give excellent heat resistance, a cured product thereof (silicone gel), and the like.

BACKGROUND ART

In recent years, power modules, with IGBT (insulated Gate Bipolar Transistor) as a main device, have come to be widely used in power converters. A case of power module is filled with a silicone gel having a low elastic modulus in order to insulate and protect a surface of a ceramic insulating substrate and a power semiconductor chip on the substrate.

In recent years, a SiC (silicon carbide) power semiconductor has smaller energy loss and calorific value during energization and higher heat resistance than conventional silicon power semiconductors, so that it becomes possible to handle larger power, and studies have been actively conducted.

Heat-resistant limit temperature of silicon power semiconductor devices is about 150° C., but it has been considered to be used at 200 to 300° C. for SiC power semiconductor devices, and higher heat resistance has been required for a resin used for SiC power semiconductors, and also for additives used to the resin. In order to actually guarantee high temperature continuous operation of IGBT power module, it is required to pass a test specified in UL1557, for example.

In the test, it is required that dielectric breakdown voltage of the product standard can be maintained at a high temperature exceeding 150° C. for a predetermined time, for example. However, w % ben exposed to such a high temperature for a long period of time, the silicone gel is hardened and deteriorated, causing cracks in the silicone gel from places where stress is concentrated inside the IGBT power module, or peeling from constituent members. If it occurs near the insulating substrate, it becomes difficult to maintain the dielectric breakdown voltage.

As a method for suppressing such hardening and deterioration, in general silicone oils and rubbers, it is possible to improve its heat resistance by adding fillers such as iron oxide and titanium oxide thereto. However, this method causes deterioration of insulation, sedimentation of filler, and decrease in workability due to an increase in viscosity, and is unsuitable as a silicone gel material for an IGBT power module that requires low viscosity and insulation.

As a method for achieving long-term dielectric breakdown voltage under high temperature, in addition to the method for improving heat resistance of silicone gel alone as described above, there is also an example in which measures are taken in a modular structure. In Patent Document 1 (JP-A 2014-150204), by arranging a sheet member made of resin, metal, ceramic material or the like on a surface of silicone gel that seals a module, deterioration of corrosion and insulation of a power element and the like and hardening and deterioration of silicone gel are suppressed. Further, in Patent Document 2 (JP-A 2015-220238), by arranging an in-plane stress relaxer made of a heat-resistant hard resin such as polyphenylene sulfide or a heat-resistant ceramic on a wall surface inside a module case, peeling of silicone gel from a side wall of the case is suppressed.

However, there is a limit even if the measures with the modular structure as described above are taken, and further, much cost and time are required.

Patent Document 3 (JP-A 2014-216558) discloses a power semiconductor module that enhances heat resistance of silicone gel alone and can be used in a high temperature environment. However, no matter how much the heat resistance of silicone gel alone is enhanced, the hardening and deterioration of silicone gel itself is suppressed in a high temperature environment, but the silicone gel peels off from a module case or a semiconductor substrate over time due to thermal stress, and as a result, electrical insulation is lost. Further, if penetration of the sealed silicone gel is designed to be high in order to alleviate stress applied to a bonding wire or the like as much as possible, bubbles are likely to be generated in the silicone gel or at an interface with the substrate in a high temperature environment, and as a result, there has been a problem that the electrical insulation is lost.

With regard to a phenomenon that electrical insulation deteriorates by peeling of silicone gel from the semiconductor substrate, it has been considered to suppress the peeling from the semiconductor substrate by adding an adhesion-imparting agent such as a silane coupling agent to the silicone gel. However, depending on the type of silane coupling agent used, the silicone gel may peel off from the semiconductor substrate over time during heating, or the electrical insulation may deteriorate when exposed to high temperature and high humidity for a long period of time.

PRIOR ART DOCUMENTS

Patent Documents

Patent Document 1: JP-A 2014-150204
Patent Document 2: JP-A 2015-220238
Patent Document 3: JP-A 2014-216558

SUMMARY OF INVENTION

Technical Problem

The present invention has been made in view of the above circumstances, and an object of the present invention is to provide a silicone gel composition that gives a silicone gel cured product which is a silicone gel having excellent heat resistance at high temperatures and adhesive properties to metals and having a large penetration, is not only capable of maintaining a low elastic modulus and a low stress even when used for a long period of time at high temperatures, but is also suppressed in generation of air bubbles, peeling from the substrate, and deterioration of electrical insulation, thus is capable of imparting long-term reliability of operation in a high temperature environment, to a power semiconductor module used as a power semiconductor sealing, and a cured product thereof, and a power module.

Solution to Problem

As a result of intensive studies to achieve the above object, the present inventor has found that a silicone gel composition containing an isocyanuric acid derivative having a specific structure having at least two trialkoxysilyl groups as an adhesion-imparting agent, one or more alkoxysilyl group-containing ketene silyl acetal compounds having the following general formula (3) and/or a partial hydrolytic condensate thereof and preferably also containing a specific heat resistance improver composed of a reaction product of an organopolysiloxane and a carboxylate of cerium, which is cured to provide a silicone gel cured product having a penetration of 30 to 70 according to in JIS K2220, solves the above problems, and has accomplished the present invention.

[Chem. 1]

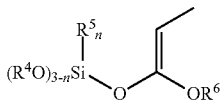

(3)

wherein $R^4$ and $R^5$ are alkyl groups having 1 to 4 carbon atoms, $R^6$ is an alkyl group having 1 to 12 carbon atoms, each of $R^4$, $R^5$ and $R^6$ may be the same or different group, and n is 0 or 1.

That is, the present invention provides the following silicone gel composition and a cured product (silicone gel) thereof, and the like.

[1]

A silicone gel composition comprising:

(A) 100 parts by weight of an organopolysiloxane having at least one alkenyl group bonded to silicon atom in one molecule.

(B) an organohydrogenpolysiloxane having at least two hydrogen atoms bonded to silicon atoms in one molecule comprising the following component (b-1) and component (b-2) in an amount such that hydrogen atoms bonded to silicon atoms in the whole component (B) are 0.01 to 3 mol per 1 mol of alkenyl groups in the component (A), (b-1) an organohydrogenpolysiloxane having at least three hydrogen atoms bonded to silicon atoms in one molecule, represented by the average composition formula (1):

$$(R^2{}_3SiO_{1/2})_b(R^2{}_2SiO)_c(HR^2SiO)_d \qquad (1)$$

wherein each of $R^2$s represents the same or different monovalent hydrocarbon group, b is a positive number of 0.01 to 0.3, c is a positive number of 0.2 to 0.89, d is a positive number of 0.1 to 0.7, and b+c+d=1, (b-2) an organohydrogenpolysiloxane having at least two hydrogen atoms bonded to silicon atoms in one molecule, represented by the average composition formula (2):

$$R^3{}_eH_fSiO_{(4-e-f)/2} \qquad (2)$$

wherein $R^3$ is independently an unsubstituted or substituted monovalent hydrocarbon group free of an aliphatic unsaturated bond, e is a positive number of 0.7 to 2.2, and f is a positive number of 0.001 to 0.5, provided that e+f is 0.8 to 2.5, (provided that excluding the organohydrogenpolysiloxane of the component (b-1)), (C) effective amount as a catalyst of a platinum group metal-based curing catalyst, (D) 0.01 to 3 parts by weight of an isocyanuric acid derivative having two trialkoxysilyl groups and one alkenyl group or one hydrogen atom bonded to a silicon atom (SiH group) in one molecule, and/or an isocyanuric acid derivative having three trialkoxysilyl groups in one molecule, and (E) 0.01 to 10 parts by weight of one or more alkoxysilyl group-containing ketene silyl acetal compounds having the general formula (3) and/or a partial hydrolytic condensate thereof:

[Chem. 1]

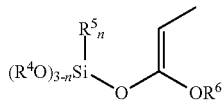

(3)

wherein $R^4$ and $R^5$ are alkyl groups having 1 to 4 carbon atoms, $R^6$ is an alkyl group having 1 to 12 carbon atoms, each of $R^4$. $R^5$ and $R^6$ may be the same or different group, and n is 0 or 1, which is cured to provide a silicone gel cured product having a penetration of 30 to 70 according to JIS K2220.

[2]

The silicone gel composition according to [1], further comprising (F) a reaction product of the following (a) and (b) in an amount of 0.01 to 50 parts by weight per 100 parts by weight of the component (A), (a) an organopolysiloxane having a viscosity of 10 to 10,000 mPa·s at 25° C., and (b) a carboxylate of cerium having the general formula (4):

$$(R^1COO)_nCe \qquad (4)$$

wherein each of $R^1$s is the same or different monovalent hydrocarbon group, and a is 3 or 4.

[3]

The silicone gel composition according to [1] or [2], wherein the component (D) is at least one selected from isocyanuric acid derivatives having the following formulas (5) to (7);

[Chem. 3]

(5)

[Chem. 4]

(6)

[Chem. 5]

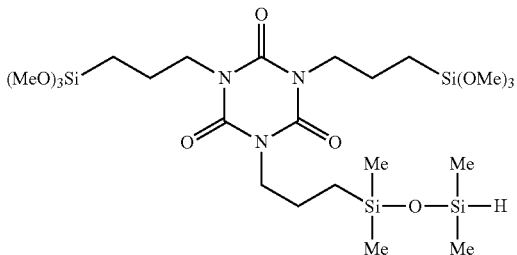

(7)

in each of the above formulas, Me represents a methyl group.

[4]

The silicone gel composition according to any one of [1] to [3], which is cured to provide a silicone gel cured product having a volume resistivity of 1 TΩ·m or more (JIS K6271, applied voltage 500 V).

[5]

A silicone gel cured product obtained by curing the silicone gel composition according to any one of [1] to [4], having a penetration of 30 to 70 according to JIS K2220.

[6]

The silicone gel cured product according to [5], which has a volume resistivity of 1 TΩ·m or more (JIS K6271, applied voltage 500 V).

[7]

The silicone gel cured product according to [5] or [6], which has a rate of decrease in the penetration of 20% or less after 1,000 hours in a 200° C. atmosphere.

[8]

A power module having the silicone gel cured product according to any one of [5] to [7] in a layered state.

Advantageous Effects of Invention

The silicone gel composition of the present invention provides a silicone gel cured product that has less change in hardness under high temperature than a conventional one, has excellent adhesion (adhesive properties) and excellent electrical insulation to a substrate used for an IGBT power module or the like, and also can maintain them for a long period of time. That is, if the silicone gel cured product obtained by curing the silicone gel composition of the present invention is used for protecting electronic components in a silicon power semiconductor device, particularly a SiC power semiconductor device, it is expected to be very useful for guaranteeing high temperature continuous operation in an atmosphere above 200° C.

DESCRIPTION OF EMBODIMENTS

The silicone gel composition of the present invention contains the following components (A) to (E), preferably components (A) to (F) as essential components. In the present invention, the silicone gel cured product (or silicone gel) is a cured product with low cross-linking density containing organopolysiloxane as a principal component and means one having a penetration according to JIS K2220 (¼ cone) of 10 to 100. This shows a measured value (rubber hardness value) of 0 in a rubber hardness measurement according to JIS K6301, which corresponds to one with low hardness (that is, soft) showing no effective rubber hardness value and low elasticity. On this point, it is different from a so-called silicone rubber cured product (rubber-like elastic body).

Hereinafter, the present invention is described in detail.

[Component (A)]

An organopolysiloxane of the component (A) used in the present invention is a main agent (base polymer) of the silicone gel composition, and is an organopolysiloxane having at least one (usually 1 to 20, preferably 2 to 10, more preferably about 2 to 5) alkenyl group bonded to a silicon atom in one molecule (hereinafter referred to as "silicon atom-bonded alkenyl group").

Specific examples of the silicon atom-bonded alkenyl group in the component (A) include a vinyl group, an allyl group, a propenyl group, an isopropenyl group, a butenyl group, an isobutenyl group, a pentenyl group, a hexenyl group, a cyclohexenyl group, a heptenyl group and the like, having 2 to 10 carbon atoms, and it is particularly preferably a vinyl group. Bonding position of this silicon atom-bonded alkenyl group in the organopolysiloxane molecule may be a terminal of a molecular chain, a non-terminal of the molecular chain (that is, a side chain of the molecular chain), or both of them.

The content of the silicon atom-bonded alkenyl group in the component (A) is preferably 0.001 to 10 mol, and particularly preferably 0.001 to 1 mol, in 100 g of the component.

In the organopolysiloxane molecule of the component (A), an organic group bonded to a silicon atom other than the silicon atom-bonded alkenyl group (hereinafter, also referred to as "silicon atom-bonded organic group") is not particularly limited, as long as it is an organic group free of an aliphatic unsaturated bond. Examples thereof include unsubstituted or substituted monovalent hydrocarbon groups having usually 1 to 12 carbon atoms and preferably 1 to 10 carbon atoms, excluding aliphatic unsaturated bonds, and the like. Examples of the unsubstituted or substituted monovalent hydrocarbon group include alkyl groups such as methyl, ethyl, propyl, butyl, pentyl, hexyl and heptyl; cycloalkyl groups such as cyclohexyl; aryl groups such as phenyl, tolyl, xylyl and naphthyl; aralkyl groups such as benzyl and phenethyl; halogenated alkyl groups in which hydrogen atoms of these groups are partially or fully substituted with a halogen atom(s) such as a chlorine atom(s), a fluorine atom(s), and a bromine atom(s), for example, a chloromethyl group, a 3-chloropropyl group and a 3,3,3-trifluoropropyl group; and the like. Among of these, alkyl groups and aryl groups are preferred, and methyl and phenyl are more preferred.

In addition, a molecular structure of the component (A) is not limited, and examples thereof include linear (that is, a diorganopolysiloxane in which a main chain basically consisting of repeating diorganosiloxane units and both terminals of the molecular chain are blocked with triorganosiloxy groups, and the like), branched, partially branched linear, and dendritic structures, and it is preferably a linear or partially branched linear structure. The component (A) may be a single polymer having this molecular structure, a copolymer consisting of these molecular structures, or a mixture of these polymers.

The component (A) has a viscosity at 25° C. of preferably 100 to 500,000 mPa·s, and particularly preferably 300 to 100,000 mPa·s, because workability of the composition and mechanical properties of the cured product become more excellent. In the present invention, the viscosity can be measured by a rotational viscometer (for example, a BL type, a BH type, a BS type, a cone and plate type, a rheometer, or the like) (the same applies hereinafter). For the same reason, the number of silicon atoms (or degree of polymerization) in the component (A) may be usually 50 to 1,500, preferably 100 to 1,000, and more preferably about 150 to 800. In the present invention, the degree of polymerization (or molecular weight) can be determined as, for example, the polystyrene-equivalent number average degree of polymerization (or numerical average molecular weight) in gel permeation chromatography (GPC) analysis using toluene or the like as a developing solvent or the like (the same applies hereinafter).

Specific examples of the component (A) include the following.

Dimethylpolysiloxane blocked at both terminals with dimethylvinylsiloxy groups, dimethylsiloxane-methylvinylsiloxane copolymers blocked at both terminals with dimethylvinylsiloxy groups, dimethylsiloxane-diphenylsiloxane copolymers blocked at both terminals with dimethylvinylsiloxy groups, dimethylsiloxane-methylvinylsiloxane-diphenylsiloxane copolymers blocked at both terminals with dimethylvinylsiloxy groups, methyltrifluoropropylpolysiloxane blocked at both terminals with dimethylvinylsiloxy groups, dimethylsiloxane-methyltrifluoropropylsiloxane copolymers blocked at both terminals with dimethylvinylsiloxy groups, dimethylsiloxane-methyltrifluoropropylsiloxane-methylvinylsiloxane copolymers blocked at both terminals with dimethylvinylsiloxy groups, dimethylsiloxane-vinylmethylsiloxane copolymers blocked at both terminals with trimethylsiloxy groups, dimethylsiloxane-vinylmethylsiloxane-diphenylsiloxane copolymers blocked at both terminals with trimethylsiloxy groups, vinylmethylsiloxane-methyltrifluoropropylsiloxane copolymers blocked at both terminals with trimethylsiloxy groups, dimethylpolysiloxane blocked at terminals with a trimethylsiloxy group and a dimethylvinylsiloxy group, dimethylsiloxane-methylvinylsiloxane copolymers blocked at terminals with a trimethylsiloxy group and a dimethylvinylsiloxy group, dimethylsiloxane-diphenylsiloxane copolymers blocked at terminals with a trimethylsiloxy group and a dimethylvinylsiloxy group, dimethylsiloxane-diphenylsiloxane-methylvinylsiloxane copolymers blocked at terminals with a trimethylsiloxy group and a dimethylvinylsiloxy group, methyltrifluoropropylpolysiloxane blocked at terminals with a trimethylsiloxy group and a dimethylvinylsiloxy group, dimethylsiloxane-methyltrifluoropropylsiloxane copolymers blocked at terminals with a trimethylsiloxy group and a dimethylvinlsiloxv group, dimethylsiloxane-methyltrifluoropropylsiloxane-methylvinlsiloxane copolymers blocked at terminals with a trimethylsiloxy group and a dimethylvinylsiloxy group, dimethylpolysiloxane blocked at both terminals with methyldivinylsiloxy groups, dimethylsiloxane-methylvinylsiloxane copolymers blocked at both terminals with methyldivinylsiloxv groups, dimethylsiloxane-diphenylsiloxane copolymers blocked at both terminals with methyldivinylsiloxy groups, dimethylsiloxane-methylvinylsiloxane-diphenylsiloxane copolymers blocked at both terminals with methyldivinylsiloxy groups, methyltrifluoropropylpolysiloxane blocked at both terminals with methyldivinylsiloxy groups, dimethylsiloxane-methyltrifluoropropylsiloxane copolymers blocked at both terminals with methyldivinylsiloxy groups, dimethylsiloxane-methyltrifluoropropylsiloxane-methylvinylsiloxane copolymers blocked at both terminals with methyldivinylsiloxy groups, dimethylpolysiloxane blocked at both terminals with trivinylsiloxy groups, dimethylsiloxane-methylvinylsiloxane copolymers blocked at both terminals with trivinylsiloxy groups, dimethylsiloxane-diphenylsiloxane copolymers blocked at both terminals with trivinylsiloxy groups, dimethylsiloxane-methylvinylsiloxane-diphenylsiloxane copolymers blocked at both terminals with trivinylsiloxy groups, methyltrifluoropropylpolysiloxane blocked at both terminals with trivinylsiloxy groups, dimethylsiloxane-methyltrifluoropropylsiloxane copolymers blocked at both terminals with trivinylsiloxy groups, dimethylsiloxane-methyltrifluoropropylsiloxane-methylvinylsiloxane copolymers blocked at both terminals with trivinylsiloxy groups, and the like.

The organopolysiloxane of the component (A) may be used alone or in combination of two or more.

[Component (B)]

An organohydrogenpolysiloxane of the component (B) used in the present invention is a component that functions as a crosslinking agent (curing agent) in hydrosilylation addition curing reaction with the component (A), and is an organohydrogenpolysiloxane having at least two hydrogen atoms bonded to silicon atoms in one molecule comprising two types of organohydrogenpolysiloxane components (b-1) and (b-2).

The component (b-1) is represented by the following average composition formula (1) and is a linear organohydrogenpolysiloxane having at least three hydrogen atoms bonded to silicon atoms in one molecule only in a bifunctional siloxane unit present at a non-terminal of the molecular chain (in the middle of the molecular chain).

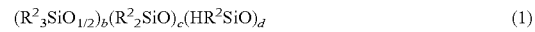

$(R^2{}_3SiO_{1/2})_b(R^2{}_2SiO)_c(HR^2SiO)_d$ (1)

wherein each of $R^2$s represents the same or different monovalent hydrocarbon group, b is a positive number of 0.01 to 0.3, c is a positive number of 0.2 to 0.89, d is a positive number of 0.1 to 0.7, and b+c+d=1.

The organohydrogenpolysiloxane of the component (b-1) is not limited except that it is a linear organohydrogenpolysiloxane which has at least 3, preferably 3 to 140 and more preferably about 4 to 100 hydrogen atoms bonded to silicon atoms in one molecule (hereinafter, also referred to as "silicon atom-bonded hydrogen atoms (that is, SiH groups)", which has the silicon atom-bonded hydrogen atoms (SiH group) only in a main chain of a molecular chain excluding terminals as hydrogen atoms bonded to silicon atoms at a non-terminal of the molecular chain (in the middle of the molecular chain) as a bifunctional organohydrogensiloxane unit represented by $(HR^2SiO_{2/2})$, which essentially contains a bifunctional diorganosiloxane unit represented by $(R^2{}_2SiO_{2/2})$ in the main chain of the molecular chain, and which is blocked with a triorganosyloxy group represented by $(R^2{}_3SiO_{1/2})$ in a terminal of the molecular chain.

In the above formula (1), each of $R^2$s is the same or different monovalent hydrocarbon group, and is preferably an unsubstituted or substituted monovalent hydrocarbon group having usually 1 to 10 carbon atoms and preferably 1 to 6 carbon atoms, and examples thereof include alkyl groups such as methyl, ethyl, propyl, butyl, pentyl, hexyl and heptyl; cycloalkyl groups such as cyclohexyl; alkenyl groups such as vinyl and allyl; aryl groups such as phenyl, tolyl, xylyl and naphthyl; aralkyl groups such as benzyl and phenethyl; halogenated alkyl groups in which hydrogen atoms of these groups are partially or fully substituted with a halogen atom(s) such as a chlorine atom(s), a fluorine atom(s), and a bromine atom(s), for example, a chloromethyl group, a 3-chloropropyl group and a 3,3,3-trifluoropropyl group; and the like, and it is preferably an unsubstituted monovalent hydrocarbon group free of an aliphatic unsaturated bond such as alkyl groups and aryl groups, and more preferably methyl, phenyl, or the like.

b is a positive number of 0.01 to 0.3 and preferably 0.03 to 0.2, c is a positive number of 0.2 to 0.89 and preferably 0.3 to 0.8, d is a positive number of 0.1 to 0.7 and preferably 0.1 to 0.5, and b+c+d=1. If b is less than 0.01, a silicone gel cured product cannot be obtained, and if b exceeds 0.3, displacement durability of the cured product decreases. Also, if d is less than 0.1, a silicone gel cured product cannot be obtained, and if d exceeds 0.7, sparse and dense are generated on a uniform surface of the cured product.

A molecular structure of the component (b-1) is not particularly limited as long as it is satisfies the above requirements, and the component (b-1) is synthesized by a conventionally known method.

The organohydrogenpolysiloxane of the component (b-1) has a viscosity at 25° C. of usually 1 to 10,000 mPa·s, preferably 3 to 2,000 mPa·s, and more preferably 10 to 1,000 mPa·s, and it is desirably liquid at room temperature (25° C.).

Specific examples of the organohydrogenpolysiloxane having the average composition formula (1) include copolymers composed of $(CH_3)_3SiO_{1/2}$ units, $(CH_3)_2SiO$ units and $H(CH_3)SiO$ units (that is, dimethylsiloxane-methylhydrogensiloxane copolymers blocked at both terminals of the molecular chain with trimethylsiloxy groups), copolymers composed of $(CH_3)_3SiO_{1/2}$ units, $(C_6H_5)_2SiO$ units, $(CH)SiO$ units and $H(CH_3)SiO$ units (dimethylsiloxane-methylhydrogensiloxane-diphenylsiloxane copolymers blocked at both terminals of the molecular chain with trimethylsiloxy groups), copolymers composed of $(CH_3)_2(C_6H_5)SiO_{1/2}$ units, $(CH_3)_2SiO$ units and $H(CH_3)SiO$ units (dimethylsiloxane-methylhydrogensiloxane copolymers blocked at both terminals of the molecular chain with dimethylphenylsiloxy groups), copolymers composed of $(CH_3)_3SiO_{1/2}$ units, $(CH_3)_2SiO$ units and $H(C_6H_5)SiO$ units (dimethylsiloxane-phenylhydrogensiloxane copolymers blocked at both terminals of the molecular chain with trimethylsiloxy groups), copolymers composed of $(CH_3)_2(CF_3C_2H_4)SiO_{1/2}$ units, $(CH_3)(CF_3C_2H_4)SiO$ units and $H(CH_3)SiO$ units (methyl(trifluoropropyl)siloxane-methylhydrogensiloxane copolymers blocked at both terminals of the molecular chain with dimethyl(trifluoropropyl)siloxy groups), copolymers composed of $(CH_3)_2(CF_3C_2H_4)SiO_{1/2}$ units, $(CH_3)(CF_3C_2H_4)SiO$ units, $(CH_3)_2SiO$ units and $H(CH_3)SiO$ units (methyl(trifluoropropyl)siloxane-dimethylsiloxane-methylhydrogensiloxane copolymers blocked at both terminals of the molecular chain with dimethyl(trifluoropropyl)siloxy groups), copolymers composed of $(CH_3)_3SiO_{1/2}$ units, $(CH_3)(CF_3C_2H_4)SiO$ units and $H(CH_3)SiO$ units (methyl (trifluoropropyl)siloxane-methylhydrogensiloxane copolymers blocked at both terminals of the molecular chain with trimethylsiloxy groups), copolymers composed of $(CH_3)_3SiO_{1/2}$ units, $(CH_3)(CF_3C_2H_4)SiO$ units, $(CH_3)_2SiO$ units and $H(CH_3)SiO$ units (methyl(trifluoropropyl)siloxane-dimethylsiloxane-methylhydrogensiloxane copolymers blocked at both terminals of the molecular chain with trimethylsiloxy groups), copolymers composed of $(CH_3)_3SiO_{1/2}$ units, $(CH_3)(CF_3C_2H_4)SiO$ units, $(CH_3)_2SiO$ units and $H(CF_3C_2H_4)SiO$ units (methyl(trifluoropropyl)siloxane-dimethylsiloxane-(trifluoropropyl)hydrogensiloxane copolymers blocked at both terminals of the molecular chain with trimethylsiloxy groups), and the like.

The organohydrogenpolysiloxane of the component (b-1) may be used alone or in combination of two or more.

Next, the component (b-2) is an organohydrogenpolysiloxane having at least two silicon atom-bonded hydrogen atoms in one molecule, represented by the average composition formula (2):

$$R^3{}_eH_fSiO_{(4-e-f)/2} \tag{2}$$ 

wherein $R^3$ is independently an unsubstituted or substituted monovalent hydrocarbon group free of an aliphatic unsaturated bond, e is a positive number of 0.7 to 2.2, and f is a positive number of 0.001 to 0.5, provided that, e+f is 0.8 to 2.5.

The organohydrogenpolysiloxane of the component (b-2) has silicon atom-bonded hydrogen atoms of at least 2, preferably at least 3, more preferably 500 as an upper limit, further preferably 200 as an upper limit, and particularly preferably 100 as an upper limit, in one molecule, and further has no aliphatic unsaturated bond in the molecule. The component (b-2) does not include the component (b-1). Further, among the silicon atom-bonded hydrogen atoms (SiH groups) contained at least two in the molecule of the component (b-2), at least one silicon atom-bonded hydrogen atom (SiH group) is preferably a hydrogen atom bonded to a silicon atom present at a terminal of the molecular chain, for example, as a diorganohydrogensiloxy unit such as a $(HR^3{}_2SiO_{1/2})$ unit.

In the above formula (2), $R^3$ is independently an unsubstituted or substituted monovalent hydrocarbon group free of an aliphatic unsaturated bond, and has a non-substituted or substituted monovalent hydrocarbon group having usually 1 to 10 carbon atoms and preferably 1 to 6 carbon atoms, and examples thereof include alkyl groups such as methyl, ethyl, propyl, butyl, pentyl, hexyl and heptyl; cycloalkyl groups such as cyclohexyl; aryl groups such as phenyl, tolyl, xylyl and naphthyl; aralkyl groups such as benzyl and phenethyl; halogenated alkyl groups in which hydrogen atoms of these groups are partially or fully substituted with a halogen atom(s) such as a chlorine atom(s), a fluorine atom(s), and a bromine atom(s), for example, a chloromethyl group, a 3-chloropropyl group and a 3,3,3-trifluoropropyl group; and the like. Among of these, alkyl groups and aryl groups are preferred, and methyl and phenyl are more preferred.

e is a positive number of 0.7 to 2.2 and preferably 1.0 to 2.0, f is a positive number of 0.001 to 0.5 and preferably 0.005 to 0.4, provided that, e+f is 0.8 to 2.5 and preferably 1.1 to 2.4.

A molecular structure of the component (b-2) is not particularly limited as long as it satisfies the above requirements, and the component (b-2) is synthesized by a conventionally known method.

The organohydrogenpolysiloxane of the component (b-2) has a viscosity at 25° C. desirably in a range in which it is liquid at room temperature (25° C.) that satisfies a range of preferably 0.1 to 5,000 mPa·s, more preferably 0.5 to 1,000 mPa·s and particularly preferably 2 to 500 mPa·s since workability of the composition and optical or mechanical properties of the cured product are more excellent. When satisfying the above viscosity, the number of silicon atoms (or degree of polymerization) in one molecule of organohydrogenpolysiloxane is usually 2 to 1,000, preferably 3 to 300, and more preferably about 4 to 150.

Examples of the organohydrogenpolysiloxane having the average composition formula (2) include 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, methylhydrogensiloxane-dimethylsiloxane cyclic copolymers, dimethylpolysiloxane blocked at both terminals with dimethylhydrogensiloxy groups, dimethylsiloxane-methylhydrogensiloxane copolymers blocked at both terminals with dimethylhydrogensiloxy groups, methylhydrogensiloxane-dimethylsiloxane-diphenylsiloxane copolymers blocked at both terminals with dimethylhydrogensiloxy groups, methylhydrogensiloxane-dimethylsiloxane-methylphenylsiloxane copolymers blocked at both terminals with dimethylhydrogensiloxy groups, dimethylsiloxane-methylhydrogensiloxane copolymers blocked at one terminal with a dimethylhydrogensiloxy group and blocked at one terminal with a trimethylsiloxy group, copolymers composed of $(CH_3)_2HSiO_{1/2}$ units, $(CH_3)_3SiO_2$ units and $SiO_{4/2}$ units, copolymers composed of $(CH_3)_2HSiO_{1/2}$ units and $SiO_{4/2}$ units, and copolymers composed of $(CH_3)_2HSiO_{1/2}$ units, $SiO_{4/2}$ units and $(C_6H_5)SiO_{3/2}$ units, those in which methyl groups of these exemplary compounds are partially or fully substituted with other alkyl groups, phenyl groups or the like, and the like, excluding those contained in the component (b-1).

The organohydrogenpolysiloxane of the component (b-2) may be used alone or in combination of two or more.

As the component (B), the ratio of the component (b-1) to the component (b-2) used is preferably 1:1 to 1:200, more preferably 1:3 to 1:150, and further preferably 1:10 to 1:120, in terms of weight ratio of (b-1):(b-2). If the amount of the (b-1) component is too large, penetration may become extremely low and there are cases where it cannot be adjusted to a desired penetration, and if the amount is too small, it may not be cured as silicone gel.

The amount of the component (B) added (that is, a total amount of the component (b-1) and the component (b-2) added) is such an amount that the total of silicon atom-bonded hydrogen atoms (SiH groups) in the whole component (B) per 1 mol of the silicon atom-bonded alkenyl group in the component (A) is 0.01 to 3 mol, preferably 0.05 to 2 mol, more preferably 0.2 to 1.5 mol, and further preferably 0.6 to 1 mol. If the amount of silicon atom-bonded hydrogen atoms from the component (B) is less than 0.01 mol per 1 mol of the silicon atom-bonded alkenyl group in the component (A), a silicone gel cured product cannot be obtained. If the amount is more than 3 mol, heat resistance of the silicone gel cured product decreases.

[Component (C)]

The component (C) of the present invention is used as a catalyst for promoting an addition reaction with the silicon atom-bonded alkenyl group in the component (A) and the silicon atom-bonded hydrogen atom in the component (B). The component (C) is a platinum group metal-based curing catalyst (platinum or platinum-based compound), and known one can be used. Specific examples thereof include platinum group metal-based curing catalysts such as platinum black, chloroplatinic acid, alcohol-modified products of chloroplatinic acid and the like; and complexes of chloroplatinic acid and olefin, aldehyde, vinylsiloxane, acetylene-alcohol or the like.

The compounding amount of the component (C) may be an effective amount as a catalyst and can be appropriately increased or decreased depending on a desired curing rate, but usually, it is in a range of 0.1 to 1,000) ppm, and preferably 1 to 300 ppm by weight of a platinum group metal atom per a total amount of the components (A) and (B). If this compounding amount is too large, heat resistance of a cured product to be obtained may decrease.

[Component (D)]

The component (D) of the present invention is an adhesion-imparting agent that imparts self-adhesive properties to the silicone gel composition, and an isocyanuric acid derivative shown below is used.

That is, the component (D) of the present invention is at least one selected from an isocyanuric acid derivative having three alkyl groups substituted with trialkoxysilyl groups such as a trimethoxysilyl group and a triethoxysilyl group (for example, a trialkoxysilyl-substituted ethyl group, a trialkoxysilyl-substituted propyl group or the like) in one molecule, and an isocyanuric acid derivative having two alkyl groups substituted with the trialkoxysilyl groups in one molecule and having as a functional group that can be involved in the hydrosilylation addition reaction, one alkenyl group such as vinyl or allyl, or one monovalent organic group containing a silicon atom-bonded hydrogen atom (SiH group) (for example, a terminal organohydrogensiloxy-substituted alkyl group, an alkyl group substituted with siloxane blocked with a terminal organohydrogensiloxy group, terminal organohydrogensilyl-substituted alkyl group, or the like). In addition, a category of the alkenyl group in the component (D) can also include a (meth)acryloxy group-substituted alkyl group (for example, a γ-(meth)acryloxipropyl group, or the like). By blending such a component (D), a composition having excellent adhesive properties to metals such as Al and Cu used as a substrate for a power semiconductor can be obtained.

Examples of the component (D) include, more specifically. (i) an isocyanuric acid derivative having three trimethoxysilyl-substituted alkyl groups in one molecule, as represented by the following formula (5), (ii) isocyanuric acid derivatives having two trimethoxysilyl-substituted alkyl groups and one alkyl group substituted with one alkenyl group or one alkyl group substituted with siloxane blocked with a terminal organohydrogensiloxy group in one molecule, as represented by the following formulas (6), (7), and isocyanuric acid derivatives in which trimethoxysilyl groups are replaced by triethoxysilyl groups in each of the formulas (5) to (7), and the like.

Here, examples of the alkyl group of the trimethoxysilyl-substituted alkyl group and the terminal organohydrogensiloxy-substituted alkyl group include an ethyl group, a propyl group, an isopropyl group, a butyl group, an isobutyl group and a tert-butyl a group, a pentyl group, a neopentyl group, a hexyl group, an octyl group and the like having 2 to 10 carbon atoms, and among of these, a propyl group is preferable.

In addition, these isocyanurnc acid derivatives may be used alone or may be used in a mixture of two or more.

[Chem. 6]

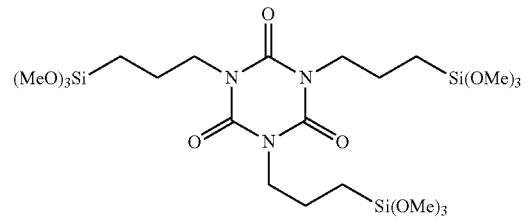

(5)

[Chem. 7]

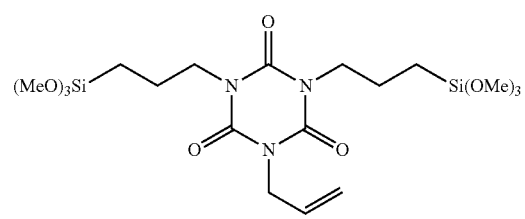

(6)

-continued

[Chem. 8]

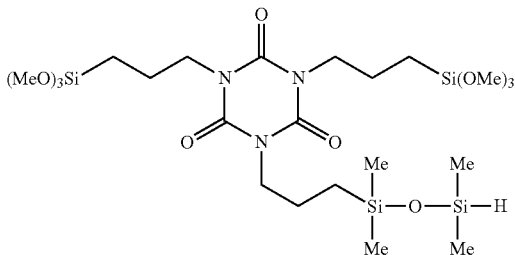

(7)

in each of the above formulas, Me represents a methyl group.

The compounding amount of the component (D) is in a range of 0.01 to 3 parts by weight, preferably 0.05 to 1 part by weight, and more preferably 0.06 to 0.9 parts by weight per 100 parts by weight of the component (A). If the compounding amount of the component (D) is too small, good adhesive properties to metals such as Al and Cu cannot be imparted, and if the compounding amount is too large, heat resistance of the silicone gel cured product significantly decreases.

In the silicone gel composition of the present invention, when the component (D) is an isocyanuric acid derivative having an alkenyl group or a SiH group bonded to a silicon atom, it is preferable that the content of the silicon atom-bonded hydrogen atom (SiH group) in the entire composition (for example, the component (B) and the component (D)) is 0.6 to 2 mol, and particular 0.8 to 1.8 mol, per 1 mol of the alkenyl group bonded to a silicon atom in the entire composition (for example, the component (A) and the component (D)).

[Component (E)]

The component (E) of the present invention is one or more ketene silyl acetal compounds containing two or three alkoxysilyl groups in the molecule having the following general formula (3) and/or a partial hydrolytic condensate thereof (that is, a ketene silyl acetal compound having a residual alkoxysilyl group(s) formed by partially hydrolyzing and condensing the alkoxysilyl groups). By using the alkoxysilyl group-containing ketene silyl acetal compound of the component (E) together with the component (D), not only excellent adhesive properties to metals such as Al and Cu used as the substrate of a power semiconductor are imparted, but also good electrical insulation for a long period of time under high temperature or high temperature and high humidity can be maintained.

[Chem. 9]

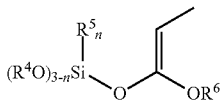

(3)

wherein $R^4$ and $R^5$ are alkyl groups having 1 to 4 carbon atoms, $R^6$ is an alkyl group having 1 to 12 carbon atoms, each of $R^4$, $R^5$ and $R^6$ may be the same or different group, and n is 0 or 1.

In the above general formula (3), the alkyl group having 1 to 4 carbon atoms of $R^4$ and $R^5$ may be linear, cyclic or branched, and examples thereof include a methyl group, an ethyl group, a propyl group, an n-butyl group, an isopropyl group, a tert-butyl group, a sec-butyl group, and an isobutyl group. In addition, the monovalent hydrocarbon group having 1 to 12 carbon atoms of $R^6$ may be linear, cyclic or branched, and examples thereof include linear alkyl groups such as methyl, ethyl, propyl, n-butyl, hexyl, heptyl, octyl, nonyl and decyl, cyclic alkyl groups such as cyclohexyl, branched alkyl groups such as tert-butyl and 2-ethylhexyl, and halogen-substituted monovalent hydrocarbon groups such as chloromethyl, bromoethyl and trifluoropropyl, in which hydrogen atoms of these groups are partially or fully substituted with a halogen atom(s) such as chlorine, fluorine, and bromine, and the like. These groups may be the same or different. In the present invention, $R^4$ is preferably a methyl group or an ethyl group, and more preferably a methyl group among them. $R^5$ is preferably a methyl group, an ethyl group, a propyl group, an n-butyl group or an isopropyl group, and more preferably a methyl group among them. Further, $R^6$ is preferably a methyl group, an ethyl group, an n-butyl group or a 2-ethylhexyl group, and more preferably an ethyl group or a 2-ethylhexyl group among them.

The component (E) can be used alone or in combination of two or more.

One or more of the alkoxysilyl group-containing ketene silyl acetal compounds and/or a partial hydrolytic condensate thereof are used in an amount of a range of 0.01 to 10 parts by weight and preferably 0.05 to 5 parts by weight per 100 parts by weight of the organopolysiloxane of the component (A). When the amount of the ketene silyl acetal compound and/or the partial hydrolytic condensate of the compound (E) added is less than 0.01 parts by weight, the silicone gel cured product to be obtained cannot develop expected adhesive properties and maintain good electrical insulation to the substrate. Further, when the amount of the ketene silyl acetal compound and/or the partial hydrolytic condensate of the compound (E) added exceeds 10 parts by weight, flexibility of the silicone gel cured product to be obtained is impaired or heat resistance of the silicone gel cured product significantly decreases.

[Component (F)]

The component (F) used in the present invention is an optional component that can be blended as needed, is a component that has a function as a heat resistance-imparting component in the silicone gel composition, and is a reaction product of (a) an organopolysiloxane and (b) a carboxylate of cerium described later.

(a) Organopolysiloxane

The (a) organopolysiloxane may be any conventionally known organopolysiloxane, may be an alkenyl group-containing organopolysiloxane of the component (A) described above, or may be an organopolysiloxane other than the component (A). In the case of an organopolysiloxane other than the component (A), those free of SiH group are preferable. It is more preferable that this is a linear or branched one which is substantially mainly composed of diorganopolysiloxane units and keeps liquid at room temperature (23° C.±15° C.).

Specific examples of an organic group bonded to a silicon atom include alkyl groups such as methyl, ethyl, propyl and butyl, alkenyl groups such as vinyl and allyl, aryl groups such as phenyl and tolyl, cycloalkyl groups such as cyclohexyl, and a chloromethyl group, a fluoropropyl group, a cyanomethyl group and the like in which hydrogen atoms bonded to these carbon atoms are partially or fully substituted with a halogen atom, a cyano group or the like, and the like.

As this organopolysiloxane, one blocked at a terminal of the molecular chain with a trialkylsiloxy group, a hydroxyl group, a vinyl group, an alkoxy group or the like can be used. Further, it may be a mixture of these various organopolysiloxanes.

Also, the organopolysiloxane has a viscosity at 25° C. of desirably 10 to 10,000 mPa·s, and more preferably 50 to 5,000 mPa·s. When the viscosity is less than 10 mPa·s, the amount of siloxane evaporated at high temperature tends to increase, and the weight change is increased, so that heat resistance tends to decrease. On the other hand, when it exceeds 10,000 mPa·s, mixing with a cerium compound described later is not smoothly performed, so that the heat resistance also tends to decrease.

Specific examples of the organopolysiloxane include, for example, dimethylpolysiloxane blocked at both terminals with trimethylsiloxy groups, dimethylsiloxane-methylvinylsiloxane copolymers blocked at both terminals with trimethylsiloxy groups, dimethylsiloxane-diphenylsiloxane copolymers blocked at both terminals with trimethylsiloxy groups, dimethylsiloxane-methylvinylsiloxane-diphenylsiloxane copolymers blocked at both terminals with trimethylsiloxy groups, methyltrifluoropropylpolysiloxane blocked at both terminals with trimethylsiloxy groups, dimethylsiloxane-methyltrifluoropropylsiloxane copolymers blocked at both terminals with trimethylsiloxy groups, dimethylsiloxane-methyltrifluoropropylsiloxane-methylvinylsiloxane copolymers blocked at both terminals with trimethylsiloxy groups, dimethylsiloxane-methyltrifluoropropylsiloxane-methylvinylsiloxane-diphenylsiloxane copolymers blocked at both terminals with trimethylsiloxy groups, dimethylpolysiloxane blocked at both terminals with dimethylvinylsiloxy groups, dimethylsiloxane-methylvinylsiloxane copolymers blocked at both terminals with dimethylvinylsiloxy groups, dimethylsiloxane-diphenylsiloxane copolymers blocked at both terminals with dimethylvinylsiloxy groups, dimethylsiloxane-methylvinylsiloxane-diphenylsiloxane copolymers blocked at both terminals with dimethylvinylsiloxy groups, methyltrifluoropropylpolysiloxane blocked at both terminals with dimethylvinylsiloxy groups, dimethylsiloxane-methyltrifluoropropylsiloxane copolymers blocked at both terminals with dimethylvinylsiloxy groups, dimethylsiloxane-methyltrifluoropropylsiloxane-methylvinylsiloxane copolymers blocked at both terminals withdimethylvinylsiloxy groups, dimethylpolysiloxane blocked at terminals with a trimethylsiloxy group and a dimethylvinylsiloxy group, dimethylsiloxane-methylvinylsiloxane copolymers blocked at terminals with a trimethylsiloxy group and a dimethylvinylsiloxy group, dimethylsiloxane-diphenylsiloxane copolymers blocked at terminals with a trimethylsiloxy group and a dimethylvinylsiloxy group, dimethylsiloxane-diphenylsiloxane-methylvinylsiloxane copolymers blocked at terminals with a trimethylsiloxy group and a dimethylvinylsiloxy group, methyltrifluoropropylpolysiloxane blocked at terminals with a trimethylsiloxy group and a dimethylvinylsiloxy group, dimethylsiloxane-methyltrifluoropropylsiloxane copolymers blocked at terminals with a trimethylsiloxy group and a dimethylvinylsiloxy group, dimethylsiloxane-methyltrifluoropropylsiloxane-methylvinylsiloxane copolymers blocked at terminals with a trimethylsiloxy group and a dimethylvinylsiloxy group, dimethylpolysiloxane blocked at both terminals with methyldivinvlsiloxy groups, dimethylsiloxane-methylvinylsiloxane copolymers blocked at both terminals with methyldivinylsiloxy groups, dimethylsiloxane-diphenylsiloxane copolymers blocked at both terminals with methyldivinylsiloxy groups, dimethylsiloxane-methylvinylsiloxane-di phenylsiloxane copolymers blocked at both terminals with methyldivinylsiloxy groups, methyltrifluoropropylpolysiloxane blocked at both terminals with methyldivinylsiloxy groups, dimethylsiloxane-methyltrifluoropropylsiloxane copolymers blocked at both terminals with methyldivinylsiloxy groups, dimethylsiloxane-methyltrifluoropropylsiloxane-methylvinylsiloxane copolymers blocked at both terminals with methyldivinylsiloxy groups, dimethylpolysiloxane blocked at both terminals with trivinylsiloxy groups, dimethylsiloxane-methylvinylsiloxane copolymers blocked at both terminals with trivinylsiloxy groups, dimethylsiloxane-diphenylsiloxane copolymers blocked at both terminals with trivinylsiloxy groups, dimethylsiloxane-methylvinylsiloxane-diphenylsiloxane copolymers blocked at both terminals with trivinylsiloxy groups, methyltrifluoropropylpolysiloxane blocked at both terminals with trivinylsiloxy groups, dimethylsiloxane-methyltrifluoropropylsiloxane copolymers blocked at both terminals with trivinylsiloxy groups, dimethylsiloxane-methyltrifluoropropylsiloxane-methylvinylsiloxane copolymers blocked at both terminals with trivinylsiloxy groups, and the like.

(b) Carboxylate of Cerium

A carboxylate of cerium is represented by the following general formula (4):

$$(R^1COO)_aCe \quad (4)$$

wherein each of $R^1$s is the same or different monovalent hydrocarbon group, and a is 3 or 4.

In the above formula (4), each of $R^1$s is the same or different monovalent hydrocarbon group having preferably 1 to 20 carbon atoms and more preferably 1 to 18 carbon atoms, and specific examples include alkyl groups such as methyl, ethyl, propyl, isopropyl, butyl, isobutyl, tert-butyl, pentyl, hexyl, cyclohexyl, octyl, 2-ethylhexyl, nonyl, decyl, undecyl, dodecyl, heptadecyl and octadecyl; alkenyl groups such as vinyl, allyl, propenyl and (Z)-8-heptadecenyl, aryl groups such as phenyl, tolyl, xylyl, naphthyl and naphthalene; aralkyl groups such as benzyl, phenylethyl and phenylpropyl; a chloromethyl group, a 3,3,3-trifluoropropyl group and the like, in which hydrogen atoms of these groups are partially or fully substituted with a halogen atom(s) such as chlorine, fluorine, and bromine, and the like.

Specific examples of the carboxylate of cerium include cerium such as a 2-ethylhexanoic acid, a naphthenic acid, an oleic acid, a lauric acid, and a stearic acid, or metal compound salts containing cerium as a principal component.

The ingredient (a) and the ingredient (b) are reacted in an amount such that the weight of cerium of the ingredient (b) is preferably 0.05 to 5 parts by weight per 100 parts by weight of the ingredient (a), and the ingredient (b) is reacted at a ratio of more preferably 0.05 to 3 parts by weight, and further preferably 0.05 to 1 part by weight per 100 parts by weight of the ingredient (a). If the amount of the ingredient (b) is too small, the heat resistance of the composition may not be improved, and if the amount is too large, the electrical insulation may be deteriorated.

The component (F) is obtained by uniformly mixing the ingredients (a) and (b) and then heat-treating the mixture, but it is difficult to obtain a uniform composition at a heating temperature of less than 120° C., and thermal decomposition rate of the ingredient (a) increases at a temperature exceeding 300° C., which is not preferable. The heat treatment temperature is preferably 150 to 300° C., preferably 200 to 300° C., and more preferably 250 to 300° C. Also, the reaction time is preferably 1 to 24 hours, and particularly preferably 1 to 16 hours.

When the ingredient (a) and the ingredient (b) are reacted, 0.5 to 5 parts by weight of an organometallic catalyst that promotes a condensation reaction of a titanium acid ester such as tetra n-butyl titanate can be blended to 100 parts by weight of the ingredient (a).

When the component (F) is blended, the compounding amount is usually 50 parts by weight or less (more than 0 parts by weight and 50 parts by weight or less), preferably 0.01 to 50 parts by weight, and more preferably 0.1 to 10 parts by weight, per 100 parts by weight of the component (A). If the amount of the component (F) is too small, the heat resistance may not be improved, and if the amount is too large, the insulation may be deteriorated.

In addition to the components (A) to (E), particularly the components (A) to (F), the silicone gel composition of the present invention can contain an optional component as long as the object of the present invention is not impaired. Examples of the optional component include reaction inhibitors, inorganic fillers, adhesion-imparting agents such as organopolysiloxanes free of a silicon atom-bonded hydrogen atom and a silicon atom-bonded alkenyl group, and alkoxyorganosilanes that contribute to improvement of adhesive properties or pressure-sensitive adhesive properties, heat-resistant additives, flame retardancy-imparting agents, thixotropy-enhancers, pigments, dyes, and the like.

The reaction inhibitor is a component for suppressing a reaction of the composition, and specific examples thereof include acetylene-based, amine-based, carboxylic acid ester-based and phosphite ester-based reaction inhibitors.

Examples of the inorganic filler include inorganic fillers such as fumed silica, crystalline silica, precipitated silica, hollow fillers, silsesquioxane, fumed titanium dioxide, magnesium oxide, zinc oxide, iron oxide, aluminum hydroxide, magnesium carbonate, calcium carbonate, zinc carbonate, layered mica, diatomaceous earth, and glass fiber; fillers obtained by surface-hydrophobicizing these fillers with an organosilicon compound such as an organoalkoxysilane compound, an organochlorosilane compound, an organosilazane compound or a low molecular weight siloxane compound, and the like. Moreover, silicone rubber powder, silicone resin powder or the like may be blended.

The silicone gel composition of the present invention can be obtained by uniformly mixing the components (A) to (E), particularly the components (A) to (F), and other arbitrary components in predetermined amounts. At that time, the components to be mixed may be divided into two parts or more as necessary and mixed, for example, it is also possible to divide the components into a part consisting of a part of the component (A) and the components (C) and (D), a part consisting of the rest of the component (A) and the components (B) and (E) (when the silicone gel composition further contains the component (F), it also contains the component (F) in addition to these components) and mix. Here, examples of the mixing means used include a homomixer, a paddle mixer, a homodisper, a colloid mill, a vacuum mixing and stirring mixer, and a planetary mixer, but it is not particularly limited as long as at least the components (A) to (E), particularly the components (A) to (F), can be mixed uniformly.

Curing conditions of the silicone gel composition of the present invention can be set at 23 to 150° C. and particularly 23 to 100° C., for 10 minutes to 8 hours and particularly 30 minutes to 5 hours.

The silicone gel cured product (silicone gel) obtained in the present invention has a penetration according to JIS K2200 of 30 to 70, preferably more than 30 and 70 or less, and more preferably 35 or more and 65 or less, and it is a silicone gel cured product, which is particularly soft among silicone gels in general.

Further, in the present invention, it is desirable that the rate of decrease in the penetration after 1,000 hours in a 200° C. atmosphere of the obtained cured product of the silicone gel composition is 20% or less, and particularly 18% or less.

In order to set the penetration to the above range, a silicone gel composition obtained by uniformly mixing the components (A) to (E) of the present invention specified above, particularly the components (A) to (F) and the optional component, in a specific compounding ratio is cured in the above curing conditions, whereby a silicone gel cured product with the above penetration can be obtained.

Moreover, the cured product of the obtained silicone gel composition has a volume resistivity (JIS K6271, applied voltage of 500 V) of preferably 1 TΩ·m or more, and particularly preferably 1 to 100 TΩ·m. In order to set the volume resistivity to the above value, a silicone gel composition obtained by uniformly mixing the components (A) to (E) of the present invention specified above, particularly the components (A) to (F) and the optional component, in a specific compounding ratio is cured in the above curing conditions, whereby a silicone gel cured product with the above volume resistivity can be obtained.

A power module according to the present invention is characterized by having the silicone gel cured product of the present invention obtained as described above in a layered state.

Here, an object to which the silicone gel cured product of the present invention is applied is a substrate to which a power semiconductor device (chip) constituting a power module is bonded (for example, one obtained by forming a copper foil (layer) on a surface of a ceramic insulating substrate) or a metal base plate to which the substrate is bonded (for example, a copper plate, an Al plate, or the like). The silicone gel cured product of the present invention can adhere well to Cu and Al on the surface of the substrate and the metal base plate, and can seal the power semiconductor device (chip) and the substrate.

The cured product of the silicone gel composition (silicone gel) of the present invention can be suitably used as an application for protecting electronic components in a silicon power semiconductor device, particularly a SiC power semiconductor device, and whereby it is expected to be very useful for guaranteeing high temperature continuous operation in an atmosphere above 200° C.

EXAMPLES

Hereinafter, the present invention is described specifically with reference to Examples and Comparative Examples, but the present invention is not limited to the following Examples. In the following Examples, "parts" indicates "parts by weight", and viscosity indicates a value measured by a rotational viscometer at 25° C. Me represents a methyl group, and Et represents an ethyl group. In addition, the degree of polymerization indicates a number average degree of polymerization in gel permeation chromatography (GPC) analysis using toluene as a developing solvent.

Component (A)

(A-1) Dimethylpolysiloxane blocked at both terminals of the molecular with dimethylvinylsiloxy groups and having a viscosity at 25° C. of about 0.6 Pa·s, represented by the formula (8):

[Chem. 10]

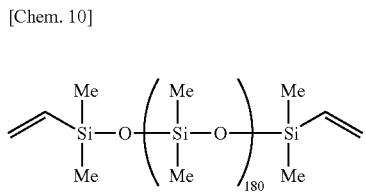

(8)

Component (B)

(B-1) As component (b-2), organohydrogenpolysiloxane having a viscosity at 25° C. of 20 mPa·s, represented by the formula (9) (dimethylpolysiloxane blocked at both terminals of the molecular with dimethylhydrogensiloxy groups):

[Chem. 11]

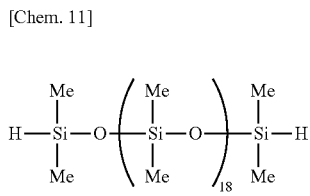

(9)

(B-2) As component (b-1), organohydrogenpolysiloxane having a viscosity at 25° C. of 110 mPa·s, represented by the formula (10) (methylhydrogensiloxane-dimethylsiloxane copolymer blocked at both terminals of the molecular with trimethylsiloxy groups):

[Chem. 12]

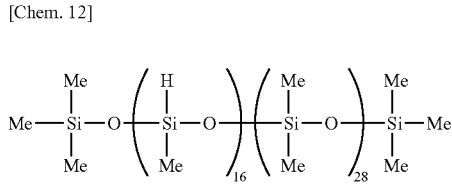

(10)

(B-3) As component (b-2), organohydrogenpolysiloxane having a viscosity at 25° C. of 50 mPa·s, represented by the formula (11) (dimethylsiloxane-methylhydrogensiloxane copolymer blocked at one terminal with a dimethylhydrogensiloxy group and blocked at one terminal with a trimethylsiloxy group):

[Chem. 13]

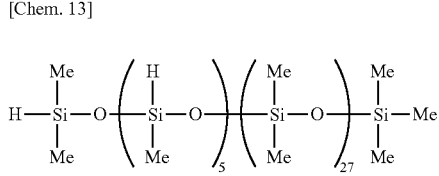

(11)

Component (C)

(C-1) Solution of chloroplatinic acid-vinylsiloxane complex with organopolysiloxane represented by the formula (12) as a solvent (platinum atom content: 1 wt %)

[Chem. 14]

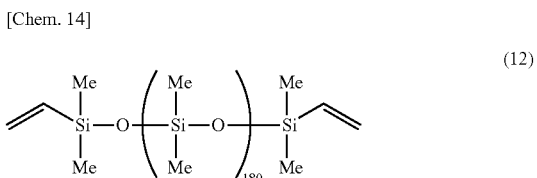

(12)

Component (D)

(D-1) Isocyanuric acid derivative represented by the formula (5):

[Chem. 15]

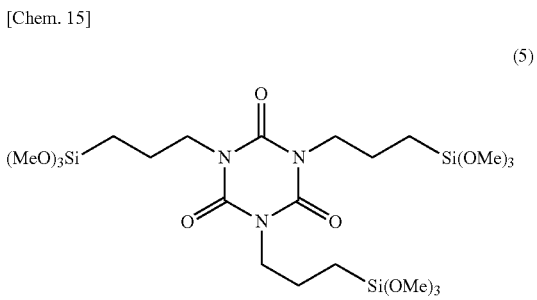

(5)

Component (E)

(E-1) Ketene silyl acetal compound represented by the formula (13):

[Chem. 16]

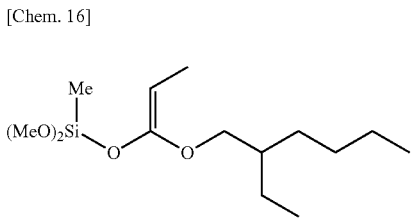

(13)

(E-2) Ketene silyl acetal compound represented by the formula (14):

[Chem. 17]

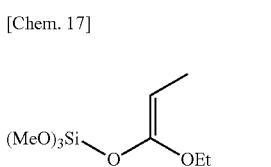

(14)

Component (F)

(F-1) Reaction product obtained by heat-treating 100 parts of dimethylpolysiloxane blocked at both terminals with trimethylsiloxy groups and having a viscosity of 100 mPa·s, 10 parts (0.55 parts as cerium amount) of turpentine solution containing cerium 2-ethylhexanoate as a principal component (rare earth element content of 6 wt %), and further 2.1 parts of tetra n-butyl titanate at a temperature of 300° C. for 1 hour.

Other Components (G-1) Control agent of catalytic activity (reaction rate): ethynylmethyldecylcarbinol (liquid)

Examples 1 to 3, Comparative Examples 1 to 5

The components (A) to (F) were blended and mixed as shown in Table 1 to prepare silicone gel compositions S1 to S8. The prepared silicone gel compositions S1 to S8 were heated at 70° C. for 60 minutes to obtain silicone gel cured products. Further, Silicone gel compositions S1 to S8 obtained above were poured so as to prepare a shear adhesion test specimen with an adhesive area of 2.5 mm$^2$ and an adhesive thickness of 2 mm using an oxygen-free copper adherend having a width of 25 mm and a length of 100 mm and cured by heating at 70° C. for 60 minutes to obtain a test piece for a shear adhesion test.

Penetration and volume resistivity of the obtained cured product, and shear adhesion and cohesive failure ratio (copper adhesive properties) to copper (oxygen-free copper) were measured using the test piece for a shear adhesion test according to JIS K6249:2003 (Testing methods for uncured and cured silicone rubber). That is, the penetration was performed by a test method according to JIS K2220 (consistency test method), the volume resistivity was performed by a test method specified in JIS K6271 (double ring electrode method), and the copper adhesive properties were performed by a test method specified in JIS K6850.

The results are shown in Table 1.

determined from a difference from an initial penetration before heat resistance test. In addition, the presence or absence of cracks in the silicone gel cured products after heat resistance test was visually evaluated.

(2) Heat Resistance Test of Silicone Gel Cured Product Layer Formed on Module Substrate Module substrates (substrates in which oxygen-free copper was soldered to both sides of a ceramic substrate with a length of 40 mm and a width of 50 mm) were each placed in a glass petri dish, and the silicone gel compositions S1 to S8 prepared were each poured thereon, and sufficiently defoamed under reduced pressure, then heated at 70° C. for 60 minutes to prepare test specimens having a cured product layer formed on the module substrate so as to have a thickness of 8 mm. The test specimens thus prepared were each allowed to stand on a hot plate set at 205° C., and the presence or absence of air bubbles generated from the substrate, peeling state and generation time thereof were observed for up to 400 hours.

[High Temperature and High Humidity Bias Test]

Power module packages sealed with the silicone gel compositions S1 to S8, respectively were prepared. For details, each of the silicone gel compositions prepared above was poured to a package mounted with a semiconductor

TABLE 1

|  |  | Example | | | Comparative Example | | | | |
|---|---|---|---|---|---|---|---|---|---|
|  |  | 1 | 2 | 3 | 1 | 2 | 3 | 4 | 5 |
| Silicone gel composition | | S1 | S2 | S3 | S4 | S5 | S6 | S7 | S8 |
| Compounding | (A-1) | 100 | 100 | 100 | 100 | 100 | 100 | 100 | 100 |
| amount | (B-1) | 8.3 | 8.3 | 7.2 | 8.3 | 8.3 | 8.3 | 8.3 | 8.3 |
| (parts by | (B-2) | 0.08 | 0.08 | 0.08 | 0.08 | 0.08 | 0.08 | 0.08 | 0.08 |
| weight) | (B-3) | 0.8 | 0.8 | 0.8 | 0.8 | 0.8 | 0.8 | 0.8 | 0.8 |
|  | (C-1) | 0.05 | 0.05 | 0.05 | 0.05 | 0.05 | 0.05 | 0.05 | 0.05 |
|  | (D-1) | 0.06 | 0.06 | 0.06 | — | 0.06 | — | — | — |
|  | (E-1) | 0.08 | — | 0.08 | — | — | 0.08 | 0.25 | — |
|  | (E-2) | — | 0.08 | — | — | — | — | — | 0.08 |
|  | (F-1) | 0.3 | 0.3 | 0.3 | 0.3 | 0.3 | 0.3 | 0.3 | 0.3 |
|  | (G-1) | 0.01 | 0.01 | 0.01 | 0.01 | 0.01 | 0.01 | 0.01 | 0.01 |
| (B) SiH/(A) SiVi (mol/mol) | | 0.96 | 0.96 | 0.83 | 0.96 | 0.96 | 0.96 | 0.96 | 0.96 |
| Penetration | | 41 | 40 | 60 | 40 | 41 | 40 | 39 | 40 |
| Volume resistivity (TΩ·m) | | 5.6 | 8.1 | 6.5 | 11 | 16 | 6.2 | 8.1 | 10 |
| Copper | Shear adhesion | 340 | 370 | 140 | 40 | 190 | 240 | 340 | 350 |
| adhesive properties | Cohesive failure ratio (%) | 100 | 95 | 90 | 0 | 80 | 70 | 100 | 90 |

Furthermore, heat resistance of the silicone gel cured product alone, heat resistance of the silicone gel cured product layer on a module substrate, and electrical insulation under high temperature and high humidity environment (high temperature and high humidity bias test) were evaluated by the methods shown below. The results are shown in Table 2.

[Heat Resistance Test]

(1) Heat Resistance Test of Silicone Gel Cured Product Alone

Using the silicone gel cured products (cured products of silicone gel compositions S1 to S8) obtained in the above examples and comparative examples, the penetration after heat resistance test at 200° C. for 1,000 hours (by the test method according to JIS K2220 (consistency test method)) was measured, and the rate of decrease in penetration was chip, an insulating substrate and the like, and sufficiently defoamed under reduced pressure, then heated at 70° C. for 60 minutes to cure the silicone gel compositions to prepare a power module package.

Using these power module package test specimens, a voltage of about 1 kV was applied in an atmosphere of 85° C.×85% RH, and the electrical insulation was evaluated. The electrical insulation was measured according to a test method of EIAJ ED4701/102A.

At 1,000 hours after the start of the test, those that could maintain a specified electrical insulation (that is, those that did not show an increase in leakage current and did not short-circuit) were evaluated as 0, and those showed insulation deterioration (those showed an increase in leakage current and short-circuited) were evaluated as X.

TABLE 2

| | | | Example | | | Comparative Example | | | | |
|---|---|---|---|---|---|---|---|---|---|---|
| | | | 1 | 2 | 3 | 1 | 2 | 3 | 4 | 5 |
| | Silicone gel composition | | S1 | S2 | S3 | S4 | S5 | S6 | S7 | S8 |
| Heat resistance | Silicone gel cured product alone (200° C. × 1,000 hours) | Penetration | Initial | 41 | 40 | 60 | 40 | 41 | 40 | 39 | 40 |
| | | | After heat resistance test | 34 | 34 | 49 | 36 | 15 | 33 | 30 | 33 |
| | | | Rate of decrease (%) | 17 | 15 | 18 | 10 | 15 | 18 | 23 | 18 |
| | | Cracks after heat resistance test | None | Norte | None | None | None | Norte | None | None |
| | Silicone gel cured product layer on module substrate (on hot plate at 205° C.) | Air bubble | None | None | None | None | None | None | None | None |
| | | Peeling | None | None | None | Peeling from copper surface | None | Peeling from copper surface | Peeling from copper surface | Peeling from copper surface |
| | | Generation time (hours) | — | — | — | 8 | — | 72 | 64 | 80 |
| | High temperature and high humidity bias test | | O | O | O | O | X | O | X | O |

From the results in Table 2, although the silicone gel compositions of Examples 1 to 3 satisfy the requirements of the present invention and are silicone gel cured products having a low elastic modulus, not only was there no significant decrease in the penetration under a long-term heat resistance of 200° C., but also the air bubbles generated from the module substrate in a high temperature state and peeling were suppressed for a long period of time.

In addition, the compositions of Examples 1 to 3 were able to maintain electrical insulation for a long period of time even under high temperature and high humidity of 85° C.×85% RH.

The invention claimed is:

1. A silicone gel composition comprising:
  (A) 100 parts by weight of an organopolysiloxane having at least one alkenyl group bonded to silicon atom in one molecule,
  (B) an organohydrogenpolysiloxane having at least two hydrogen atoms bonded to silicon atoms in one molecule comprising the following component (b-1) and component (b-2) in an amount such that hydrogen atoms bonded to silicon atoms in the whole component (B) are 0.01 to 3 mol per 1 mol of alkenyl groups in the component (A),
  (b-1) an organohydrogenpolysiloxane having at least three hydrogen atoms bonded to silicon atoms in one molecule, represented by the average composition formula (1):

$(R^2{}_3SiO_{1/2})_b(R^2{}_2SiO)_c(HR^2SiO)_d$ (1)

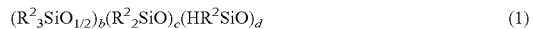

wherein each of $R^2$s represents the same or different monovalent hydrocarbon group, b is a positive number of 0.01 to 0.3, c is a positive number of 0.2 to 0.89, d is a positive number of 0.1 to 0.7, and b+c+d=1,
  (b-2) an organohydrogenpolysiloxane having at least two hydrogen atoms bonded to silicon atoms in one molecule, represented by the average composition formula (2):

$R^3{}_eH_fSiO_{(4-e-f)/2}$ (2)

wherein $R^3$s is independently an unsubstituted or substituted monovalent hydrocarbon group free of an aliphatic unsaturated bond, e is a positive number of 0.7 to 2.2, and f is a positive number of 0.001 to 0.5, provided that e+f is 0.8 to 2.5, provided that excluding the organohydrogenpolysiloxane of the component (b-1),
  (C) effective amount as a catalyst of a platinum group metal-based curing catalyst,
  (D) 0.01 to 3 parts by weight of an isocyanuric acid derivative having two trialkoxysilyl groups and one alkenyl group or one hydrogen atom bonded to a silicon atom (SiH group) in one molecule, and/or an isocyanuric acid derivative having three trialkoxysilyl groups in one molecule, and
  (E) 0.01 to 10 parts by weight of one or more alkoxysilyl group-containing ketene silyl acetal compounds having the general formula (3) and/or a partial hydrolytic condensate thereof:

[Chem. 1]

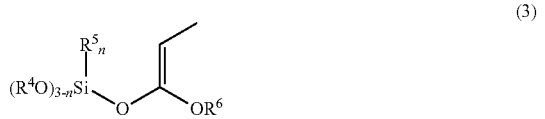

(3)

wherein $R^4$ and $R^5$ are alkyl groups having 1 to 4 carbon atoms, $R^6$ is an alkyl group having 1 to 12 carbon atoms, $R^4$, $R^5$ and $R^6$ may be the same or different groups each other, and n is 0 or 1, which is cured to provide a silicone gel cured product having a penetration of 30 to 70 according to JIS K2220.

2. The silicone gel composition according to claim 1, further comprising (F) a reaction product of the following (a) and (b) in an amount of 0.01 to 50 parts by weight per 100 parts by weight of the component (A),
  (a) an organopolysiloxane, and
  (b) a carboxylate of cerium having the general formula (4):

$(R^1COO)_aCe$ (4)

wherein each of $R^1$s is the same or different monovalent hydrocarbon group, and a is 3 or 4.

3. The silicone gel composition according to claim 1, wherein the component (D) is at least one selected from isocyanuric acid derivatives having the following formulas (5) to (7):

[Chem. 2]

(5)

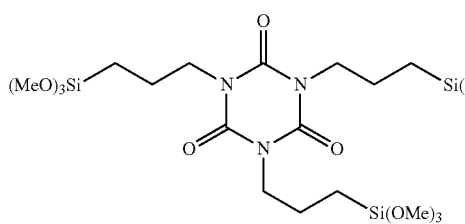

(6)

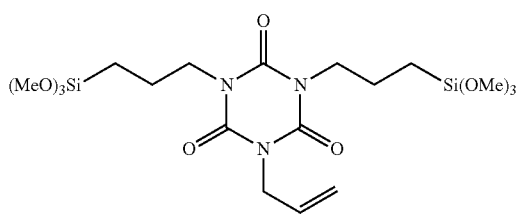

[Chem. 4]

(7)

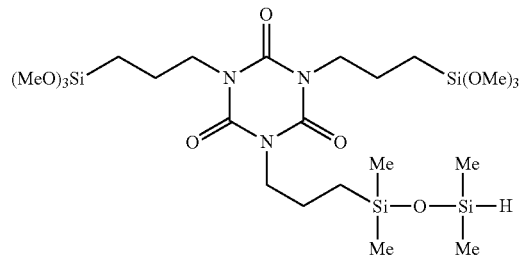

in each of the above formulas, Me represents a methyl group.

4. The silicone gel composition according to claim 1, which is cured to provide a silicone gel cured product having a volume resistivity of 1 TΩ·m or more (JIS K6271, applied voltage 500 V).

5. A silicone gel cured product obtained by curing the silicone gel composition according to claim 1, having a penetration of 30 to 70 according to JIS K2220.

6. The silicone gel cured product according to claim 5, which has a volume resistivity of 1 TΩ·m or more (JIS K6271, applied voltage 500 V).

7. The silicone gel cured product according to claim 5, which has a rate of decrease in the penetration of 20% or less after 1,000 hours in a 200° C. atmosphere.

8. A power module having the silicone gel cured product according to claim 5 in a layered state.

* * * * *